(12) United States Patent
Kuwabara

(10) Patent No.: US 6,229,331 B1
(45) Date of Patent: May 8, 2001

(54) APPARATUS FOR AND METHOD OF INSPECTING PATTERNS ON SEMICONDUCTOR INTEGRATED DEVICES

(75) Inventor: Masayuki Kuwabara, Machida (JP)

(73) Assignee: Tokyo Seimitsu Co., Ltd., Mitaka (JP)

( * ) Notice: Subject to any disclaimer, the term of this patent is extended or adjusted under 35 U.S.C. 154(b) by 0 days.

(21) Appl. No.: 09/395,264

(22) Filed: Sep. 14, 1999

(30) Foreign Application Priority Data

Dec. 2, 1998 (JP) .................................................. 10-343220

(51) Int. Cl.[7] .................................................. G01R 31/26
(52) U.S. Cl. .......................................... 324/765; 324/158.1
(58) Field of Search .............................. 324/158.1, 752, 324/765, 770; 382/254, 276, 305, 237

(56) References Cited

U.S. PATENT DOCUMENTS 5,469,274 * 11/1995 Iwasaki et al. ........................ 358/450
5,696,550 * 12/1997 Aoki et al. ............................ 348/125

* cited by examiner

*Primary Examiner*—Safet Metjahic
*Assistant Examiner*—Minh Tang
(74) *Attorney, Agent, or Firm*—Christie, Parker & Hale, LLP

(57) ABSTRACT

An apparatus correctly detects critical defects in spaces between wiring patterns on semiconductor integrated devices. The apparatus picks up gray level images from semiconductor dies, sequentially reads the images strip by strip, each strip consisting of pixels aligned in a row or column direction, calculates an optimum grouping operator for the strip, divides the pixels into groups according to the grouping operators, sets thresholds for the groups, compares the thresholds with gray level differences between the gray level images, and detects defects on the semiconductor dies. Also provided is a method to achieve this technique.

6 Claims, 15 Drawing Sheets

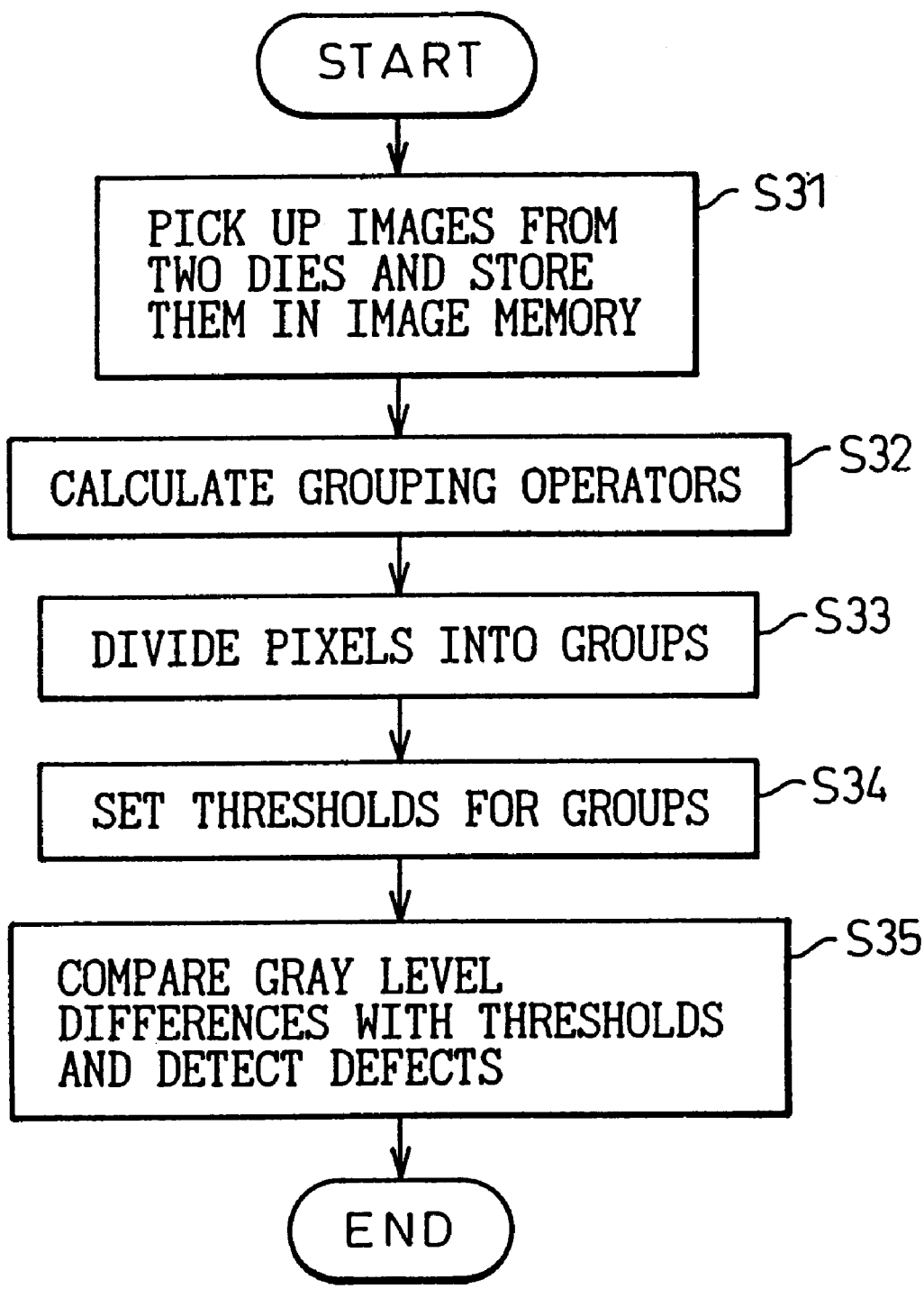

Fig.5A DEFECTIVE DIE

Fig.5B REFERENCE DIE

Fig.6A DEFECTIVE DIE

Fig.6B REFERENCE DIE

Fig.9A DEFECTIVE DIE

Fig.9B REFERENCE DIE

|   | 1 | 2 | 3 | 4 | 5 | 6 | 7 |
|---|---|---|---|---|---|---|---|
| 1 |   |   |   |   |   |   |   |
| 2 |   | 75 | 108 | 92 | 25 | 118 |   |
| 3 |   | 69 | 130 | 113 | 25 | 118 |   |
| 4 |   | 69 | 110 | 98 | 25 | 142 |   |
| 5 |   | 69 | 110 | 93 | 25 | 88 |   |
| 6 |   | 75 | 108 | 92 | 25 | 130 |   |
| 7 |   | 75 | 130 | 93 | 25 | 97 |   |
| 8 |   | 75 | 97 | 80 | 25 | 130 |   |
| 9 |   | 75 | 142 | 93 | 25 | 118 |   |
| 10 |   |   |   |   |   |   |   |

MEAN VALUE

|   | 1 | 2 | 3 | 4 | 5 | 6 | 7 |
|---|---|---|---|---|---|---|---|
| 1 |   |   |   |   |   |   |   |
| 2 |   | 0 | 50 | 35 | 0 | 0 |   |
| 3 |   | 0 | 78 | 35 | 0 | 35 |   |
| 4 |   | 0 | 35 | 35 | 0 | 45 |   |
| 5 |   | 0 | 43 | 60 | 0 | 45 |   |
| 6 |   | 0 | 0 | 60 | 0 | 35 |   |
| 7 |   | 0 | 65 | 60 | 0 | 35 |   |
| 8 |   | 0 | 35 | 35 | 0 | 0 |   |
| 9 |   | 0 | 35 | 35 | 0 | 35 |   |
| 10 |   |   |   |   |   |   |   |

RANGE VALUE

Fig.13

GROUP TABLE

|   | 1 | 2 | 3 | 4 | 5 | 6 | 7 |
|---|---|---|---|---|---|---|---|
| 1 |   |   |   |   |   |   |   |
| 2 |   | 2 | 3 | 3 | 1 | 3 |   |
| 3 |   | 2 | 3 | 3 | 1 | 3 |   |
| 4 |   | 2 | 3 | 3 | 1 | 3 |   |
| 5 |   | 2 | 3 | 3 | 1 | 3 |   |
| 6 |   | 2 | 3 | 3 | 1 | 3 |   |
| 7 |   | 2 | 3 | 3 | 1 | 3 |   |
| 8 |   | 2 | 3 | 3 | 1 | 3 |   |
| 9 |   | 2 | 3 | 3 | 1 | 3 |   |
| 10|   |   |   |   |   |   |   |

Fig.14

DIFFERENTIAL IMAGE

|    | 1 | 2 | 3  | 4  | 5  | 6  | 7  |
|----|---|---|----|----|----|----|----|
| 1  | 0 | 0 | 65 | 0  | 0  | 0  | 0  |
| 2  | 0 | 0 | 65 | 0  | 0  | 35 | 0  |
| 3  | 0 | 0 | 0  | 0  | 0  | 0  | 35 |
| 4  | 0 | 17| 43 | 15 | 30 | 10 | 35 |
| 5  | 0 | 0 | 0  | 60 | 0  | 25 | 40 |
| 6  | 0 | 0 | 65 | 60 | 0  | 0  | 35 |
| 7  | 0 | 0 | 0  | 0  | 0  | 0  | 65 |
| 8  | 0 | 0 | 65 | 25 | 0  | 35 | 35 |
| 9  | 0 | 0 | 0  | 0  | 0  | 35 | 35 |
| 10 | 0 | 0 | 0  | 0  | 0  | 0  | 65 |

Fig.16

| | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| 1 | | | | | | | | | | | | | | |
| 2 | | 108 | 142 | 125 | 92 | 142 | 142 | 108 | 108 | 142 | 125 | 92 | 142 | |
| 3 | | 108 | 142 | 125 | 92 | 142 | 142 | 108 | 108 | 142 | 125 | 92 | 142 | |
| 4 | | 108 | 142 | 125 | 92 | 142 | 142 | 108 | 108 | 142 | 125 | 92 | 142 | |
| 5 | | 108 | 142 | 125 | 92 | 142 | 142 | 108 | 108 | 142 | 125 | 92 | 142 | |
| 6 | | 108 | 142 | 125 | 92 | 142 | 142 | 108 | 108 | 142 | 125 | 92 | 142 | |
| 7 | | 108 | 142 | 125 | 92 | 142 | 142 | 108 | 108 | 142 | 125 | 92 | 142 | |
| 8 | | 108 | 142 | 125 | 92 | 142 | 142 | 108 | 108 | 142 | 125 | 92 | 142 | |
| 9 | | 108 | 142 | 125 | 92 | 142 | 142 | 108 | 108 | 142 | 125 | 92 | 142 | |
| 10 | | | | | | | | | | | | | | |

MEAN VALUE (3×3)

Fig.17

| | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| 1 | | | | | | | | | | | | | | |
| 2 | | 200 | 150 | 200 | 150 | 200 | 200 | 200 | 200 | 150 | 200 | 150 | 200 | |
| 3 | | 200 | 150 | 200 | 150 | 200 | 200 | 200 | 200 | 150 | 200 | 150 | 200 | |
| 4 | | 200 | 150 | 200 | 150 | 200 | 200 | 200 | 200 | 150 | 200 | 150 | 200 | |
| 5 | | 200 | 150 | 200 | 150 | 200 | 200 | 200 | 200 | 150 | 200 | 150 | 200 | |
| 6 | | 200 | 150 | 200 | 150 | 200 | 200 | 200 | 200 | 150 | 200 | 150 | 200 | |
| 7 | | 200 | 150 | 200 | 150 | 200 | 200 | 200 | 200 | 150 | 200 | 150 | 200 | |
| 8 | | 200 | 150 | 200 | 150 | 200 | 200 | 200 | 200 | 150 | 200 | 150 | 200 | |
| 9 | | 200 | 150 | 200 | 150 | 200 | 200 | 200 | 200 | 150 | 200 | 150 | 200 | |
| 10 | | | | | | | | | | | | | | |

RANGE VALUE (3×3)

APPARATUS FOR AND METHOD OF INSPECTING PATTERNS ON SEMICONDUCTOR INTEGRATED DEVICES

BACKGROUND OF THE INVENTION

1. Field of the Invention

The present invention relates to an apparatus for, and a method of, inspecting patterns on semiconductor integrated devices and, particularly, to an apparatus for, and a method of, optically or electro-optically inspecting the surfaces of semiconductor wafers and photomasks for defects.

2. Description of the Related Art

An apparatus according to a prior art for inspecting the appearance of semiconductor integrated devices photographs two adjacent semiconductor devices or dies, compares the images of the dies pixel by pixel, and determines that one of the dies is defective if the images disagree with each other. This prior art employs a photographing apparatus such as a combination of an optical microscope and TDI (time delay integration) image pickup elements. The photographing apparatus continuously scans a first die, which may be a defective die, in a row direction, obtains a multivalued image of the first die, and stores the image in an image memory. Similarly, the photographing apparatus picks up a multivalued image of a second die, which is a reference die and is arranged adjacent to the first die, and stores the image in the image memory. The apparatus reads the images frame by frame and compares the gray levels of corresponding pixels in the frames. Any pixel that provides a gray level difference above a threshold with respect to a corresponding pixel of the reference image is determined to be defective. This technique usually provides satisfactory defect detecting sensitivity in appearance inspection.

Recently, however, the requirements for the defect detecting sensitivity of appearance inspection have increasing due to finer design rules for semiconductor devices. To improve the defect detecting sensitivity of an inspection apparatus, semiconductor devices to be inspected must exhibit less color unevenness or process noise such as metal grain caused by surface irregularities such as metal wiring. In practice, however, it is difficult to eliminate such process noise from semiconductor devices. A location on a semiconductor device where a lot of metal grain appears scatters light to reduce light quantity entering into an object lens of a microscope, thereby lowering the gray level of a corresponding location on an image picked up from the semiconductor device. The process noise is not a critical defect such as a short circuit between wires, and therefore, it is preferable not detected. If a fixed threshold is applied to an area where the process noise is present when checking a difference between the gray levels of two pixels, the process noise will be recognized as a defect, thereby lowering the defect detecting sensitivity.

To solve this problem, experiments have been made to set higher thresholds for brighter areas where metal wires are present and lower thresholds for dark areas between the metal wires, so that process noise such as metal grain in the metal wires may not be detected as defects and critical defects such as short circuits between the wires are surely detected. For example, one prior art compares two images with each other. In each of the images, the prior art defines an area of 3×3 pixels and calculates a mean value of the gray levels of the 9 pixels in the area as well as a difference (hereinafter referred to as a range value) between the maximum and minimum of the gray levels of the 9 pixels in the area. According to at least one of the mean value and range value, the prior art selects a threshold for a center pixel of the area to test the difference between the two images. Namely, each pixel in the images is provided with a proper threshold according to a mean value and/or a range value that reflect the gray levels of peripheral pixels, to improve defect detecting sensitivity.

This prior art will be explained in more detail with reference to FIGS. 15 to 17.

FIG. 15 shows an image picked up from metal wires that are formed at intervals of 0.35 μm with each wire having a width of 0.35 μm. The image is made of pixels each of 0.20 μm in size. The metal wires 151 to 154 are alternated with spaces 155 to 158. Numerals 1 to 10 on the left side of the image are row numbers of the pixels, and numerals 1 to 14 on the top of the image are column numbers of the pixels. Each pixel is represented as (a, b) where a is a row number and b is a column number. For the sake of simplicity of explanation, the metal wires 151 to 154 involve no metal grain. The columns 3, 7, 10, and 14 are entirely in the metal wires 151 to 154, and therefore, are brightest to provide a gray level of 225. The columns 1, 5, 8, and 12 are entirely in the spaces 155 to 158, and therefore, are darkest to provide a gray level of 25. The columns 2, 4, 6, 9, 11, and 13 involve a mixture of metal wire and space to provide a gray level that is dependent on the ratio of the metal wire and space. For example, pixels in the column 6 have each a gray level of 175, pixels in the column 9 a gray level of 75, and pixels in the column 11 a gray level of 125. In practice, the gray levels of pixels in a given column are not equal to one another and vary from one to another due to process noise such as metal grain in wiring areas and boundaries between bright and dark areas. Such boundaries scatter light to further drop gray levels.

The prior art calculates at least a mean value or a range value of the gray levels of every 3×3 pixels in a given image and, according to the mean or range values calculated, divides pixels of the image into groups. Thereafter, the prior art sets a threshold for each group.

FIG. 16 shows mean values calculated for the pixels of the image of FIG. 15. The mean value of each pixel is calculated from the gray levels of 3×3 pixels with the pixel in question being at the center of the 3×3 pixels. For example, a pixel (2, 2) has a mean value of 108, which is calculated by averaging the gray levels of 3×3 pixels around the pixel (2, 2), i.e., (25×3+75×3+225×3)/9=108.3. Mean values for the other pixels are calculated similarly. Instead of directly employing the gray levels of pixels to find thresholds, this prior art employs the mean gray levels of pixels to find thresholds that cope with local conditions such as noise, darkness, and brightness, thereby improving defect detecting sensitivity.

FIG. 17 shows range values calculated for the pixels of the image of FIG. 15. The range value of each pixel is calculated from the difference between the maximum and minimum of the gray levels of 3×3 pixels with the pixel in question being at the center of the 3×3 pixels. For example, the pixel (2, 2) has a range value of 200, which is calculated from the difference between a maximum of 225 and a minimum of 25 among the gray levels of 3×3 pixels around the pixel (2, 2). Range values for the other pixels are calculated similarly. Instead of directly employing the gray levels of pixels to find thresholds, this prior art employs the range values of pixels to find thresholds that cope with local conditions such as noise, darkness, and brightness, thereby improving defect detecting sensitivity.

Depending on the nature of an object and defects to be detected, the mean values of FIG. 16 and the range values of FIG. 17 are employed to improve defect detecting sensitivity irrespective of the presence of process noise that may fluctuate the gray levels of pixels.

It is essential for the appearance inspection apparatuses to surely detect critical defects, i.e., short circuits between metal wires. To detect such critical defects, spaces between metal wires must surely be recognized. Once the spaces are recognized, proper thresholds are set for the spaces to surely detect defects in the spaces.

The prior art of FIGS. 15 to 17 is imperfect to distinguish spaces from wiring areas, and therefore, is unable to completely detect critical defects such as short circuits in the spaces between the wiring areas.

Design rules for wire widths and intervals of semiconductor devices are improving from 0.35 μm of FIG. 15 to 0.18 μm. Bright-field microscopes generally provide a pixel size of about 0.20 μm as shown in FIG. 15. The pixel size corresponds to a unit image area picked up from a wafer and is equal to a resolution.

As the design rules become finer, the 3×3 square area employed by the prior arts to calculate a mean value and range value is too large and covers metal wires and a space between them. For example, a calculation of a mean value of a pixel in the space in the column 5 of FIG. 16 is affected by a part of the wire in the column 4 and a part of the wire in the column 6. The same will happen in calculating the range values of FIG. 17. In addition, areas of the same nature frequently involve varying mean and range values. For example, the space in the column 5 of FIG. 16 has a mean value of 92 while the space in the column 8 has a mean value of 108. In spite of the columns 5 and 8 both being spaces, these columns have different mean values. Similarly, the column 5 in FIG. 17 has a range value of 150 while the column 8 has a range value of 200. Due to these variations, the prior art must employ a wide allowance of, for example, 90 to 110 for mean values and 145 to 205 for range values to define a space between metal wires.

The image of FIG. 15 involves no noise. Actual images involve process noise to make the gray levels of pixels in one column uneven. Namely, actual gray levels are not like the even gray levels of FIG. 15.

In actual semiconductor devices, noise levels in a space between metal wires are relatively low because the space is free from the influence of metal grain. In a metal wiring area, however, noise levels are high because there are random grain spots in the wiring area. The high noise levels greatly vary the mean values and the range values. Even in areas of the same nature, the actual mean and range values vary more than those of FIGS. 16 and 17.

The varying mean and range values are useless to divide pixels into groups and set thresholds for the groups because the groups based on the varying mean and range values are incorrect. Thus, it is impossible to correctly detect critical defects such as short circuits. This problem is particularly serious in range values. The prior art is unable to determine whether a pixel having a range value of 200 is in a space or in a metal wire, and therefore, is unable to detect critical defects with a range value of 200. In this way, the prior art is incapable of correctly distinguishing a group of pixels that are in a space from a group of pixels that are in a metal wire, and therefore, is incapable of improving defect detecting sensitivity.

SUMMARY OF THE INVENTION

An object of the present invention is to provide an apparatus for, and a method of, inspecting patterns on semiconductor integrated devices, capable of correctly detecting defects on the semiconductor integrated devices.

In order to accomplish the object, an aspect of the present invention provides an apparatus for inspecting patterns on semiconductor integrated devices. The apparatus has an image pickup unit for scanning patterns on first and second semiconductor integrated devices to form first and second images made of pixels represented with multivalued gray levels; an image memory for storing the first and second images; a calculation unit for sequentially reading the first and second images out of the image memory strip by strip, each strip consisting of at least two consecutive pixels aligned in one of the row and the column directions, and calculating an optimum grouping operator for a target pixel contained in the strip according to the gray levels of all pixels in the strip; a grouping unit for associating each pixel with a group according to a grouping operator calculated thus for the pixel; an image difference memory for storing gray level differences between the first and second images pixel by pixel; a threshold setting unit for setting an optimum threshold for each of the groups; and a defect detecting unit for comparing the thresholds with the gray level differences pixel by pixel and detecting defects on any one of the first and second semiconductor integrated devices.

The calculating unit has, for each of the first and second images, a row mean filter for calculating a mean of gray levels of pixels that are aligned in the row direction and form a strip; a column mean filter for calculating a mean of gray levels of pixels that are aligned in the column direction and form a strip; a row range filter for calculating a range value that is equal to a difference between maximum and minimum gray levels of pixels that are aligned in the row direction and form a strip; a column range filter for calculating a range value that is equal to a difference between maximum and minimum gray levels of pixels that are aligned in the column direction and form a strip; a smaller mean selector for selecting a smaller one of the outputs of the row and column mean filters; and a smaller range selector for selecting a smaller one of the outputs of the row and column range filters. The calculating unit further has a first selector for selecting a smaller one of the outputs of the smaller mean selectors of the first and second images; and a second selector for selecting a smaller one of the outputs of the smaller range selectors of the first and second images. The outputs of the first and second selectors are used by the grouping unit to associate each pixel with a group.

Each of the row mean filters and row range filters is an n×1 filter, and each of the column mean filters and column range filters is a 1×n filter, where n is an integer equal to or larger than 2.

The grouping unit has a lookup table that stores grouping operators and corresponding groups.

Another aspect of the present invention provides a method of inspecting patterns on semiconductor integrated devices. The method includes the steps of scanning patterns on first and second semiconductor integrated devices to form first and second images made of pixels represented with multivalued gray levels; storing the first and second images into an image memory; sequentially reading the first and second images out of the image memory strip by strip, each strip consisting of at least two consecutive pixels aligned in one of row and column directions, and calculating an optimum grouping operator for a target pixel contained in the strip according to the gray levels of all pixels in the strip; associating each pixel with a group according to a grouping operator calculated thus for the pixel; storing gray level differences between the first and second images pixel by pixel into an image difference memory; setting an optimum threshold for each of the groups; and comparing the thresholds with the gray level differences pixel by pixel and detecting defects on any one of the first and second semiconductor integrated devices.

BRIEF DESCRIPTION OF THE DRAWINGS

Other objects and features of the present invention will be described hereinafter in detail by way of preferred embodiments with reference to the accompanying drawings, in which:

FIG. 3 is a flowchart showing a method of inspecting patterns achieved by the apparatus of FIG. 1;

FIGS. 5A and 5B show mean values provided by 1×3 mean filters from the images of FIGS. 4A and 4B;

FIGS. 6A and 6B show mean values provided by 3×1 mean filters from the images of FIGS. 4A and 4B;

FIGS. 7A and 7B show range values provided by 1×3 range filters from the images of FIGS. 4A and 4B;

FIGS. 8A and 8B show range values provided by 3×1 range filters from the images of FIGS. 4A and 4B;

FIGS. 9A and 9B show smaller values selected from the mean values of FIGS. 5A to 6B;

FIG. 13 shows pixels divided into groups according to the lookup table of FIG. 12;

FIG. 14 shows a differential image generated from the images of FIGS. 4A and 4B;

FIG. 16 shows mean values provided by a conventional 3×3 mean filter from the image of FIG. 15; and FIG. 17 shows range values provided by a conventional 3×3 mean filter from the image of FIG. 15.

DESCRIPTION OF THE PREFERRED EMBODIMENTS

Figure 1:
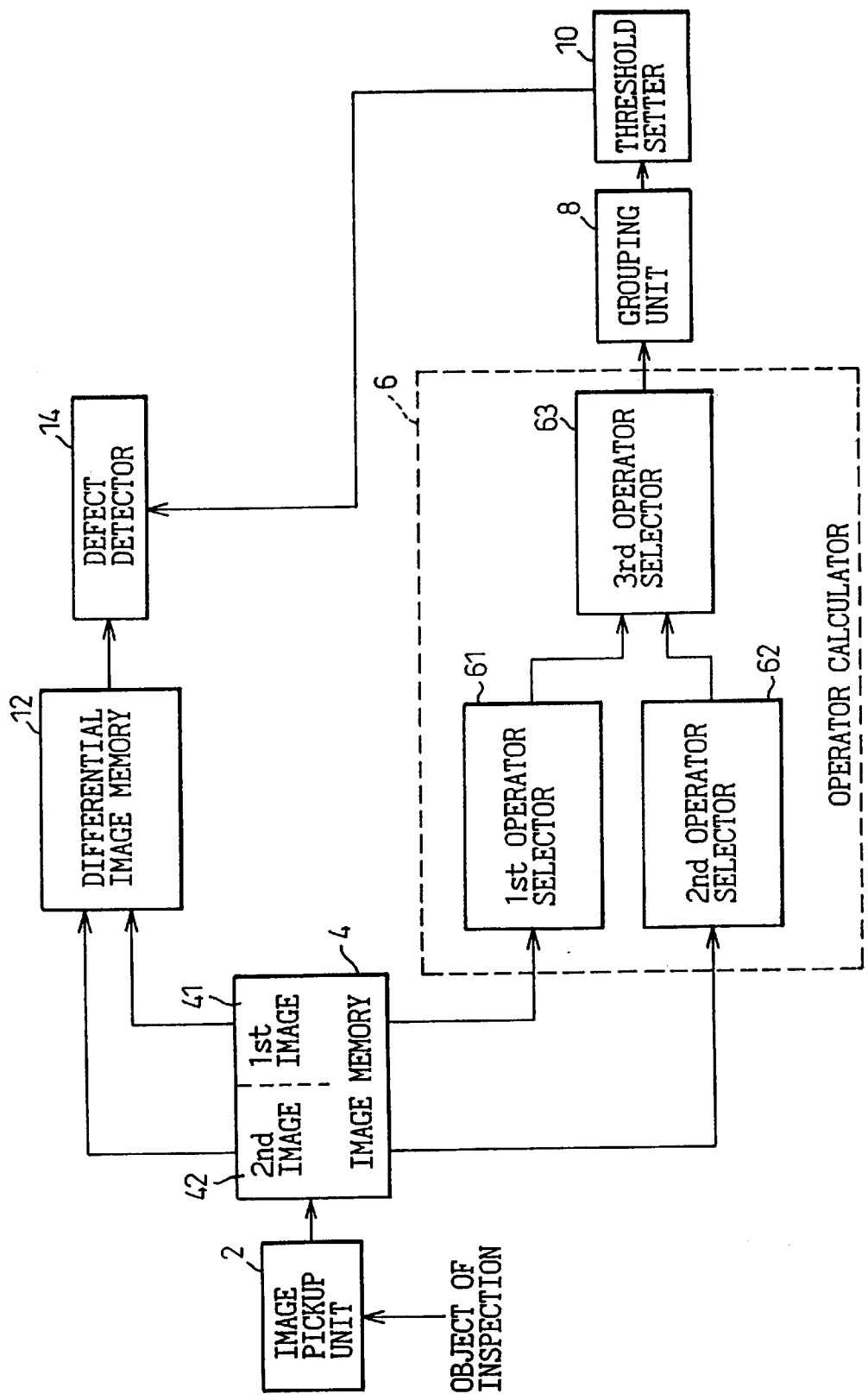
FIG. 1 is a block diagram showing an apparatus for inspecting patterns according to an embodiment of the present invention.

FIG. 1 is a block diagram showing an apparatus for inspecting patterns on semiconductor integrated circuits according to an embodiment of the present invention. The apparatus has an image pickup unit 2, an image memory 4, an operator calculator 6, a grouping unit 8, a threshold setter 10, a differential image memory 12, and a defect detector 14.

The image pickup unit 2 scans patterns on first and second semiconductor integrated devices to form first and second images made of pixels represented with multivalued gray levels. The first and second semiconductor integrated devices are dies arranged adjacent to each other for inspection, one being a reference die and the other a defective die.

The image memory 4 stores the gray levels of the pixels of the first and second images. The first image 41 may be of the defective die and the second image 42 may be of the reference die.

The operator calculator 6 is characteristic to the present invention. The operator calculator 6 sequentially reads the first and second images 41 and 42 out of the image memory 4 strip by strip. Each strip is made of a predetermined number (2 or above) of pixels consecutively aligned in a row or column direction. The operator calculator 6 calculates an operator that is optimum for associating a target pixel contained in the strip with a group. The operator calculator 6 has a first operator selector 61 for selecting an optimum operator for each pixel contained in the first image 41, a second operator selector 62 for selecting an optimum operator for each pixel contained in the second image 42, and a third operator selector 63 for selecting an optimum one of the outputs of the first and second operator selectors 61 and 62. The details of the operator calculator 6 will be explained later.

The grouping unit 8 divides the pixels of the first and second images into groups according to a lookup table or function that defines relationships between mean and range values and groups. The threshold setter 10 sets a threshold for each group. The differential image memory 12 stores gray level differences between the first and second images 41 and 42 pixel by pixel. The defect detector 14 compares the optimum thresholds provided by the threshold setter 10 with the gray level differences stored in the differential image memory 12 and detects defects on any one of the first and second semiconductor integrated devices.

Figure 2:
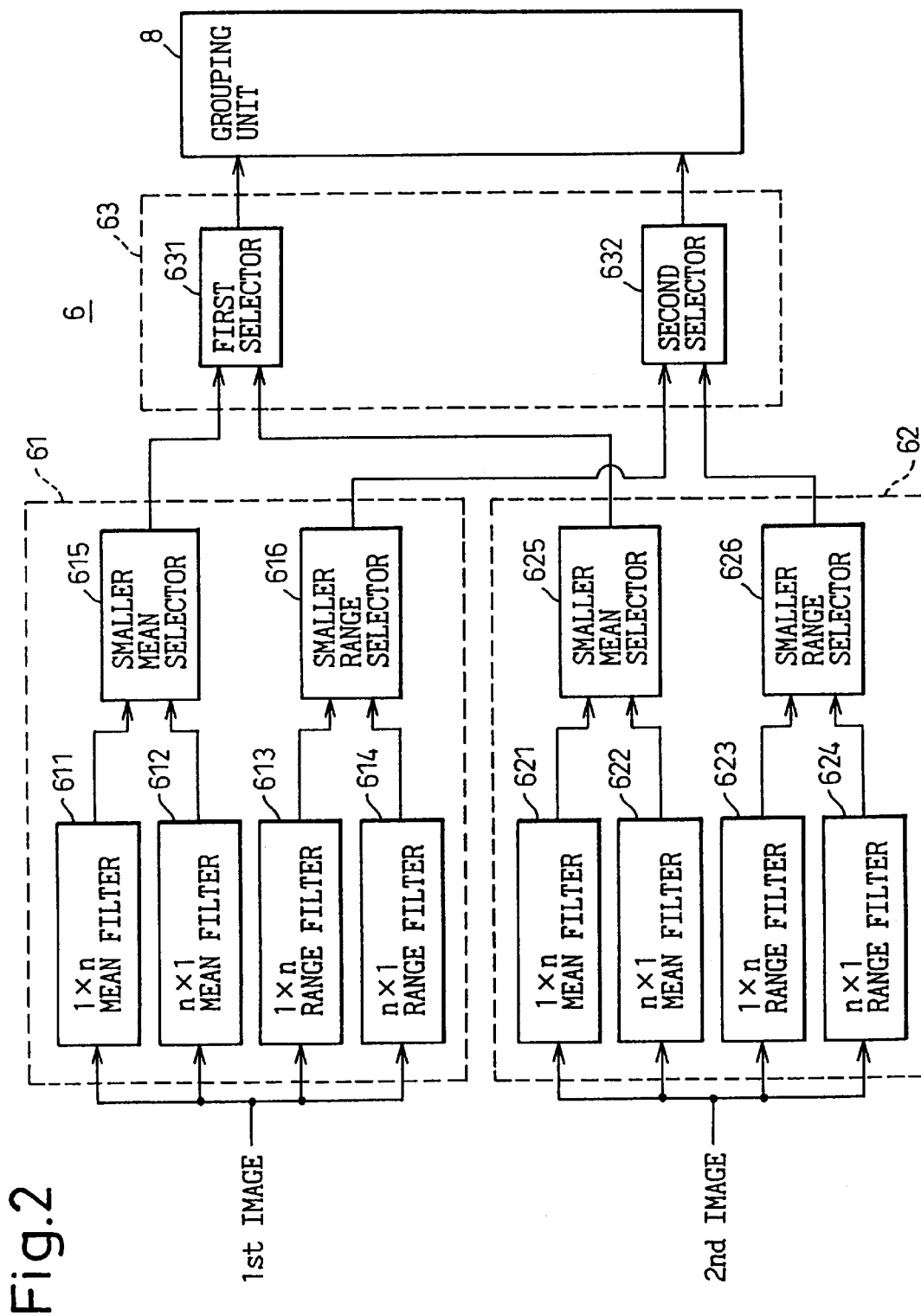
FIG. 2 is a block diagram showing the details of an operator calculator contained in the apparatus of FIG. 1.

FIG. 2 is a block diagram showing the details of the operator calculator 6. The first operator selector 61 has a 1×n mean filter 611, an n×1 mean filter 612, a 1×n range filter 613, an n×1 range filter 614, a smaller mean selector 615, and a smaller range selector 616.

The second operator selector 62 has a 1×n mean filter 621, an n×1 mean filter 622, a 1×n range filter 623, an n×1 range filter 624, a smaller mean selector 625, and a smaller range selector 626.

Here, "n" is an integer equal to or larger that 2. The filters mentioned above are not limited to the 1×n and n×1 filters. As the resolution of the image pickup unit 2 increases, the filters may be m×n and n×m filters where m and n are integers each equal to or greater than 2 with m<n.

The third operator selector 63 has a first selector 631 and a second selector 632.

FIG. 3 is a flowchart showing a pattern inspecting method achieved by the apparatus of FIGS. 1 and 2.

The method will be explained step by step.

Step S31 scans patterns on the first and second dies to form first and second images made of pixels represented with multivalued gray levels and stores the first and second images in the image memory 4.

In step S32, the operator calculator 6 sequentially reads the first and second images out of the image memory 4 strip by strip. Each strip consists of a predetermined number (at least 2) of pixels that are consecutive in a row or column direction. The operator calculator 6 calculates an operator that is optimum for associating a target pixel in the strip with a group.

In step S33, the grouping unit 8 determines a group in the lookup table corresponding to the operator of each pixel.

In step S34, the threshold setter 10 sets a threshold for each group.

Step S35 compares the thresholds with gray level differences stored in the differential image memory 12 pixel by pixel and detects defects on any one of the first and second semiconductor integrated devices.

The gray level differences between the first and second images are stored in the differential image memory 12 in any one of steps S31 and S35.

An example of the operation of the present invention will be explained with reference to FIGS. 4 to 11. In the example, the 1×n and n×1 filters 611 to 614 and 621 to 624 of FIG. 2 are 1×3 and 3×1 filters.

Figure 4B:
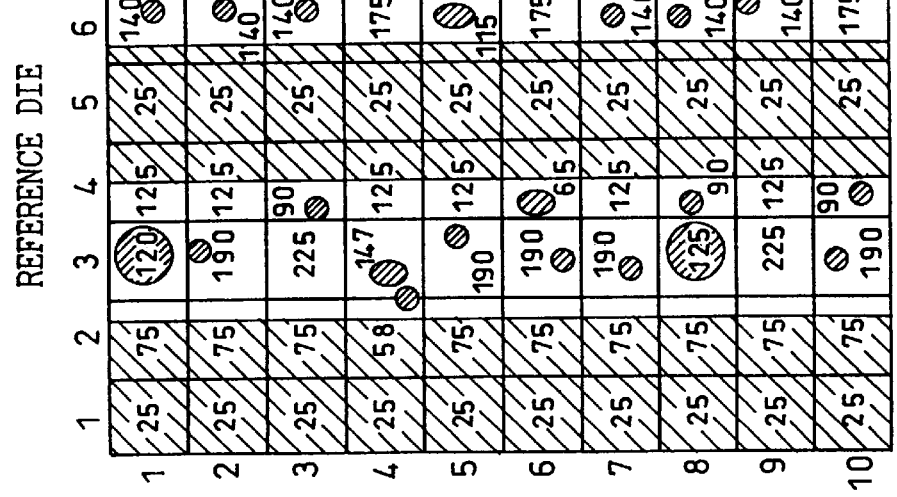
FIG. 4B shows the gray levels of pixels in an image of a reference die.
Figure 4A:
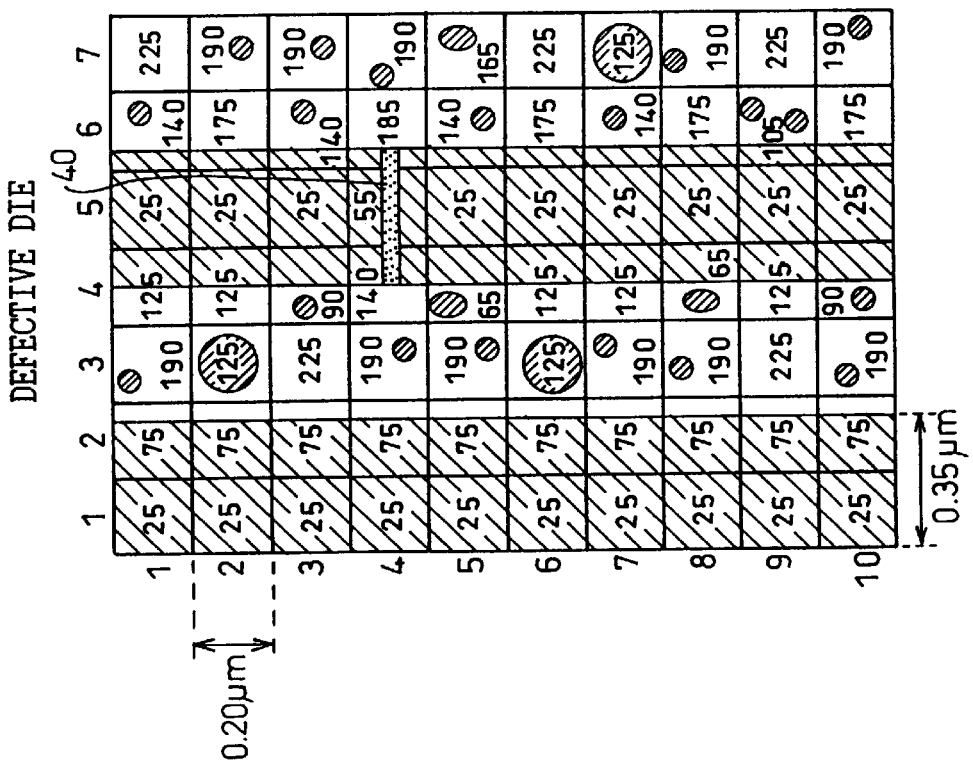
FIG. 4A shows the gray levels of pixels in an image of a defective die.
Figure 15:
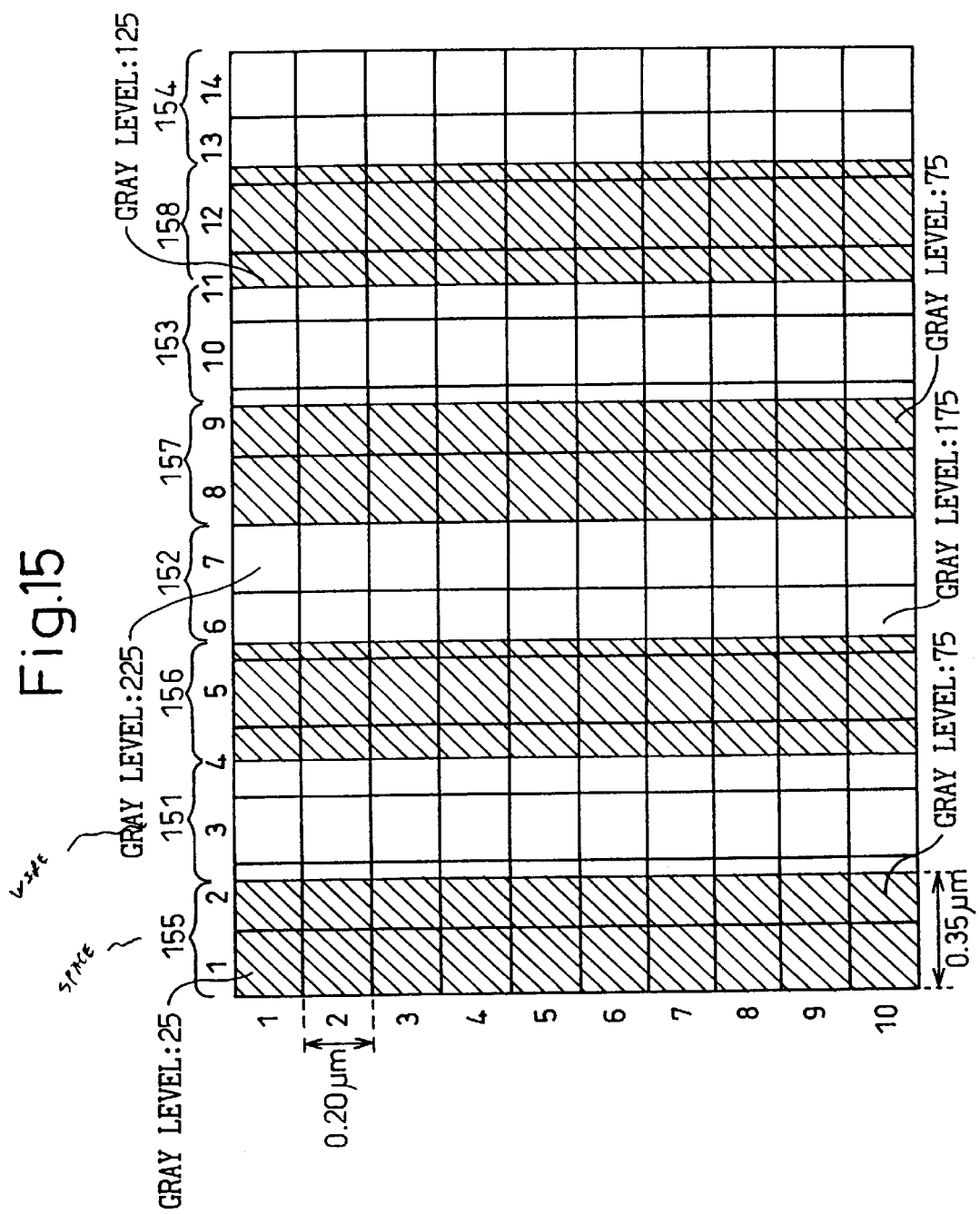
FIG. 15 shows gray levels measured on an image of an inspection object according to a prior art.

FIG. 4A shows the gray levels of a first image, which is of a defective die, and FIG. 4B shows the gray levels of a second image, which is of a reference die. Unlike the image shown in FIG. 15 having no noise, the images of FIGS. 4A and 4B involve random noise due to metal grain in metal wiring areas. The grain levels of pixels in the metal wiring areas on the defective and reference dies vary depending on the sizes of the metal grain with a maximum gray level of 225. The metal grain is process noise and should not be detected as defects.

The defective die has a defect 40, i.e., a short circuit in pixels (4, 4), (4, 5), and (4, 6) in a space between adjacent wires. The defect 40 may be a metal hair. Due to this, the grain levels of these pixels are increased from 125 to 140, from 25 to 55, and from 175 to 185.

The present invention is capable of not detecting the process noise in the metal wiring areas and is capable of surely detecting the defect 40 in the space.

The present invention employs the filters for providing strips, detects the direction of each wiring pattern, and groups spaces separately from the wiring patterns. This will be explained in detail.

Figures 5A, 5B:
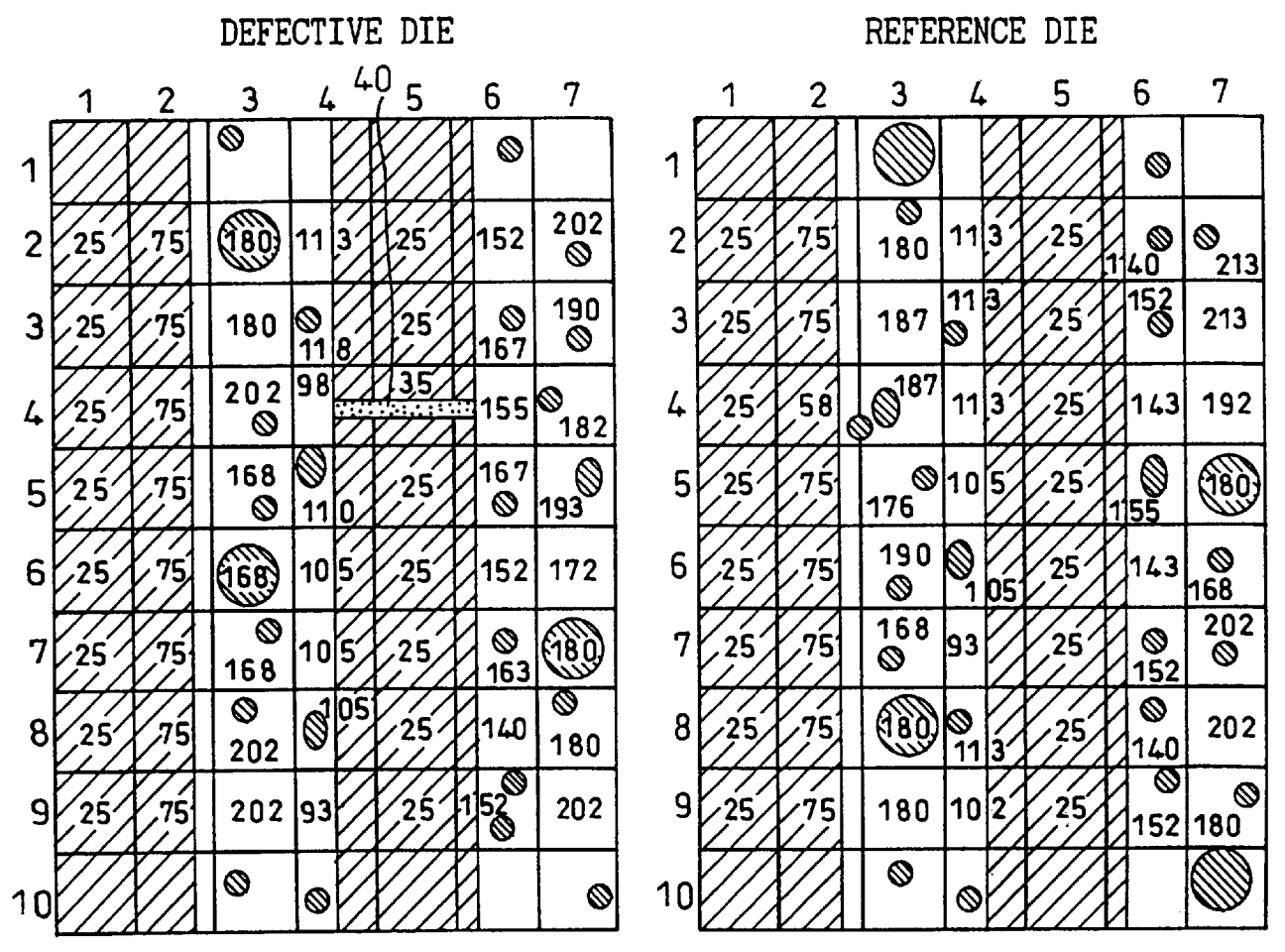

FIGS. 5A and 5B show mean values provided by the 1×3 mean filters 611 and 621 from the images of FIGS. 4A and 4B. For example, a column mean value of 35 in a pixel (4, 5) of FIG. 5A is an average of the gray levels of a strip of 1×3 pixels consecutive to each other in a column direction with the pixel (4, 5) being at the center of the strip, i.e., (25+55+25)/3=35. Column mean values for the other pixels are calculated similarly. Pixels in the first and tenth rows have no column mean values because there are no zeroth and eleventh rows to calculate them.

Figures 6A, 6B:
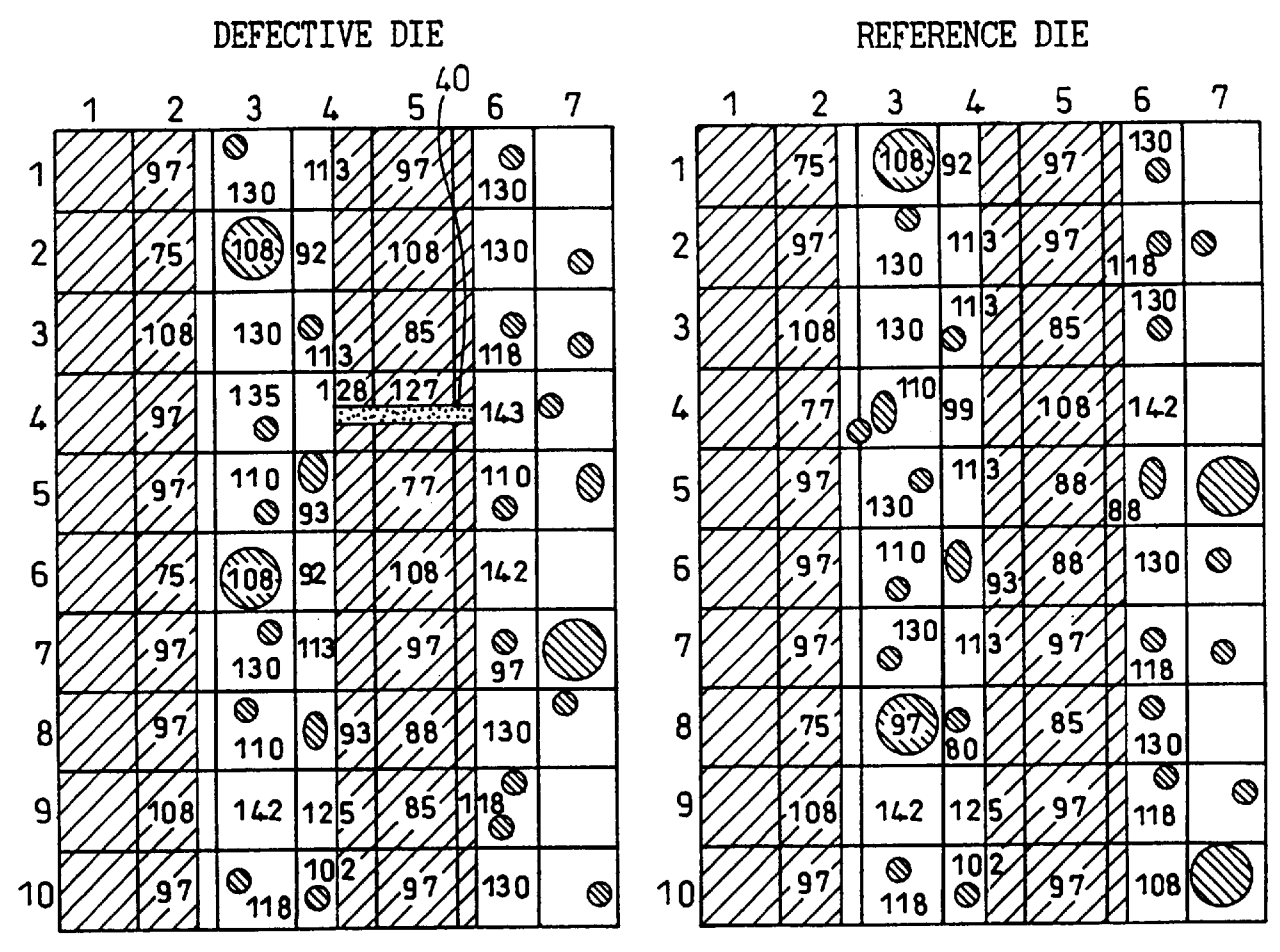

FIGS. 6A and 6B show mean values provided by the 3×1 mean filters 612 and 622 from the images of FIGS. 4A and 4B. For example, a row mean value of 128 in a pixel (4, 4) of FIG. 6A is an average of the gray levels of a strip of 3×1 pixels consecutive to each other in a row direction with the pixel (4, 4) being at the center of the strip, i.e., (190+140+55)/3=128.33. Row mean values for the other pixels are calculated similarly. Pixels in the first and seventh columns have no row mean values because there are no zeroth and eighth columns to calculate them.

Figures 7A, 7B:
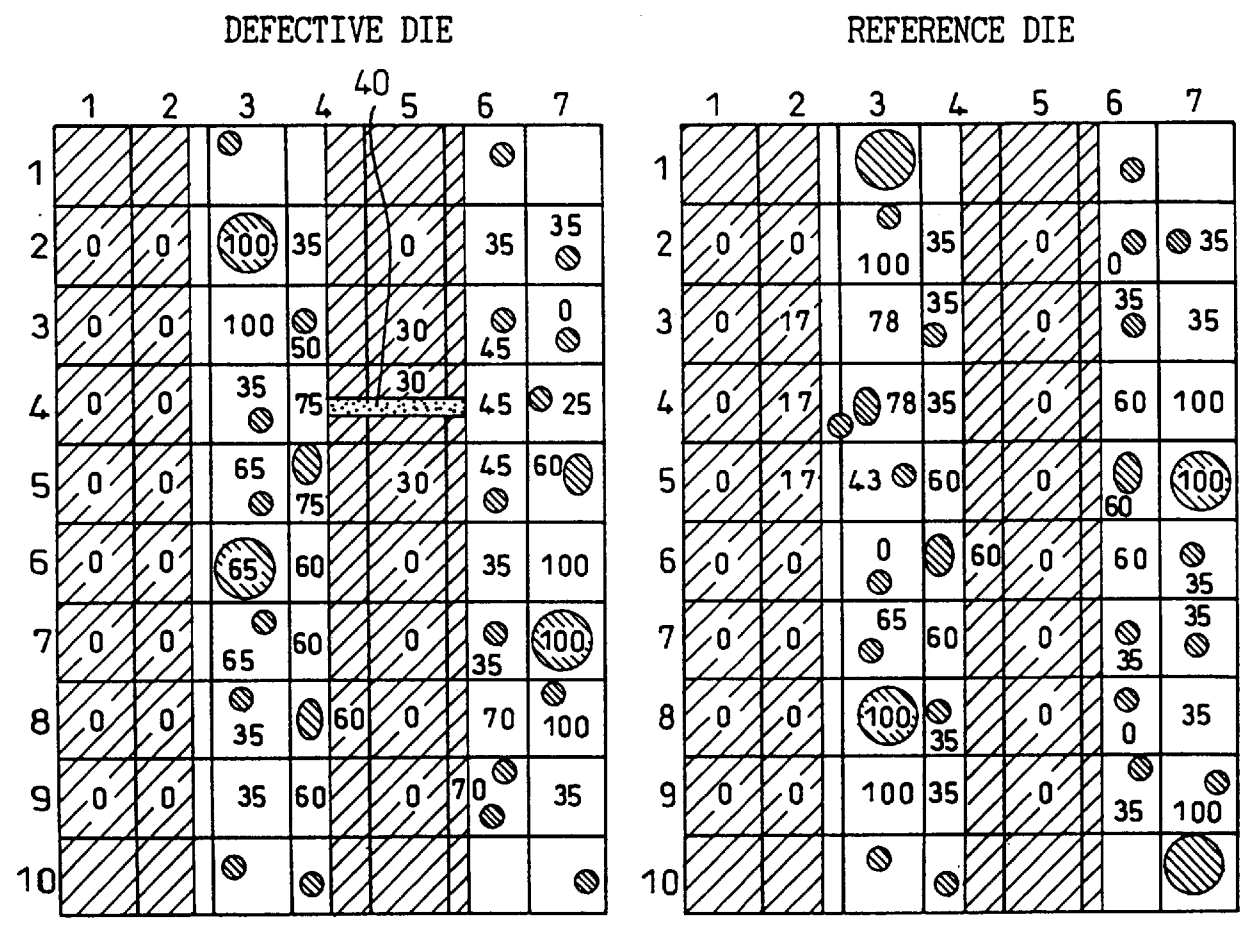

FIGS. 7A and 7B show range values provided by the 1×3 range filters 613 and 623 from the images of FIGS. 4A and 4B. For example, a column range value of 75 in the pixel (4, 4) of FIG. 7A is a difference between a maximum and a minimum of the gray levels of a strip of 1×3 pixels consecutive to each other in the column direction with the pixel (4, 4) being at the center of the strip, i.e., 140−65=75. Column range values for the other pixels are calculated similarly. Pixels in the first and tenth rows have no column range values for the same reason as for the column mean values.

Figures 8A, 8B:
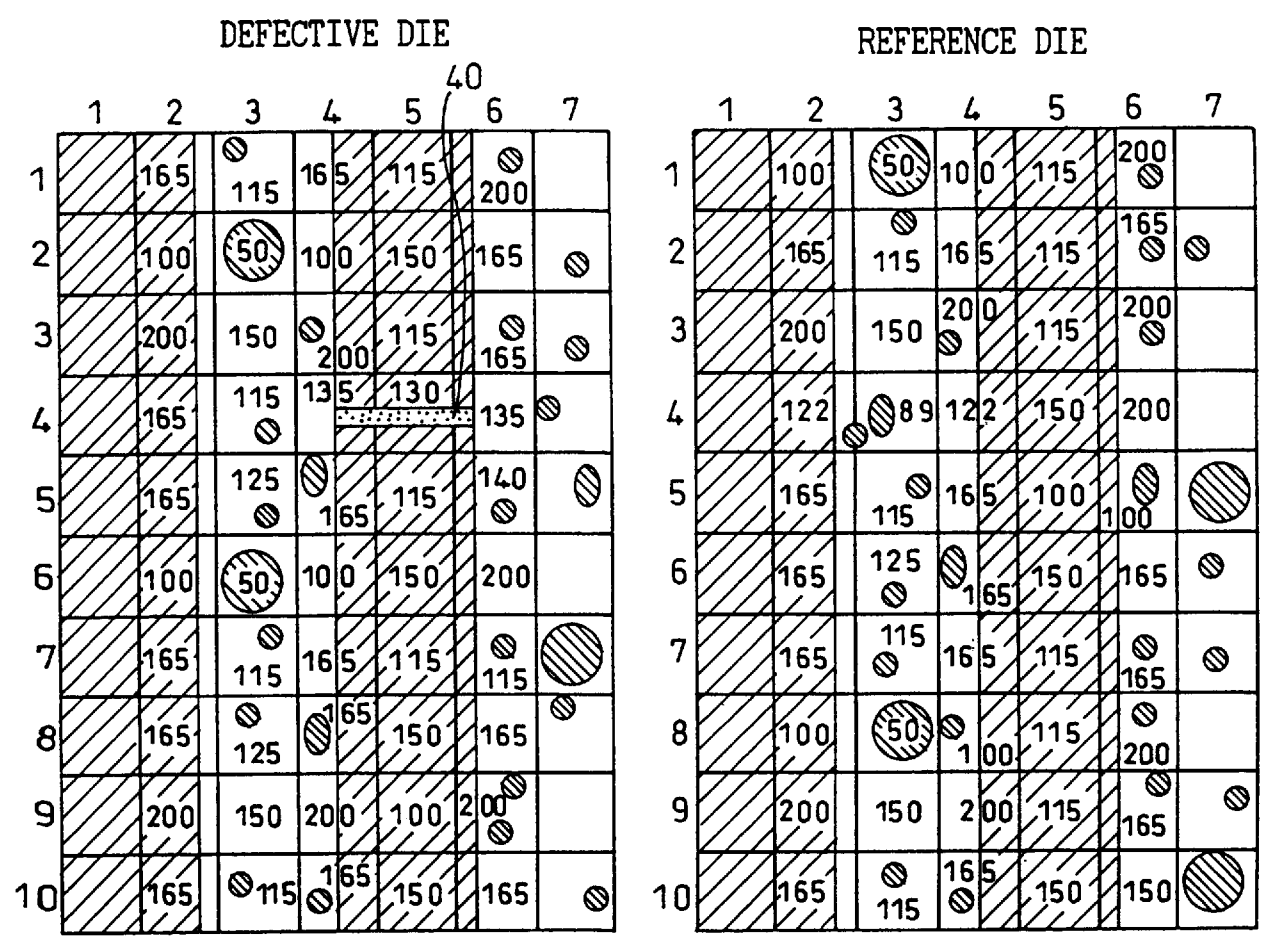

FIGS. 8A and 8B show range values provided by the 3×1 range filters 614 and 624 from the images of FIGS. 4A and 4B. For example, a row range value of 135 in the pixel (4, 4) of FIG. 8A is a difference between a maximum and a minimum of the gray levels of a strip of 3×1 pixels consecutive to each other in the row direction with the pixel (4, 4) being at the center of the strip, i.e., 190−55=135. Row range values for the other pixels are calculated similarly. Pixels in the first and seventh columns have no row range values for the same reason as for the row mean values.

Figures 9A, 9B:
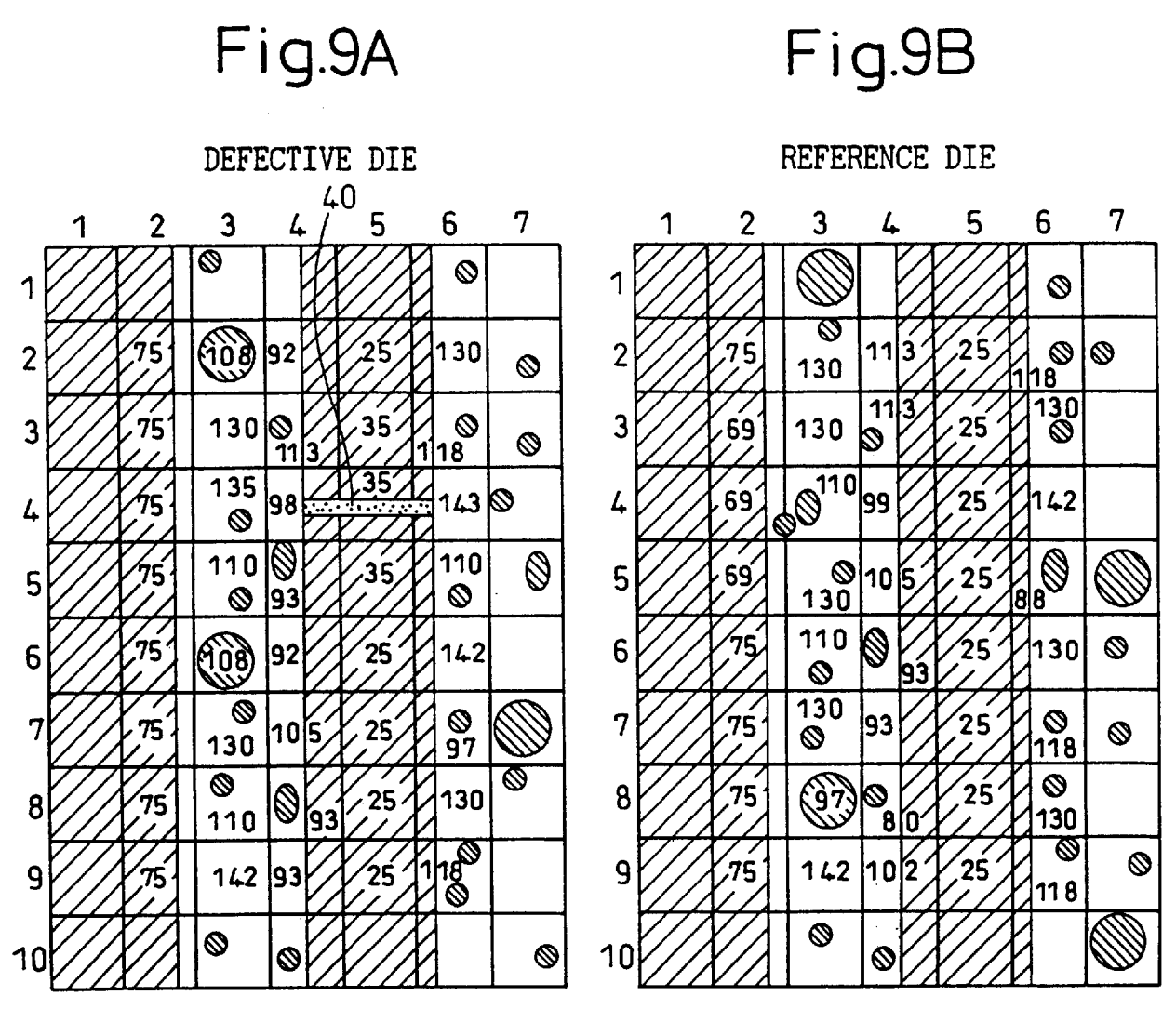

The smaller mean selector 615 selects a smaller one of the mean values of each corresponding pair of pixels of FIGS. 5A and 6A, to provide a result of FIG. 9A. In FIG. 9A, a value 98 in the pixel (4, 4) is a smaller value between 98 of the pixel (4, 4) of FIG. 5A and 128 of the same pixel of FIG. 6A. Similarly, the smaller mean selector 615 selects smaller mean values for the other pixels.

The smaller mean value selector 625 selects a smaller one of the mean values of each corresponding pair of pixels of FIGS. 5B and 6B, to provide a result of FIG. 9B. In FIG. 9B, a value 99 in a pixel (4, 4) is a smaller value between 113 of the pixel (4, 4) of FIG. 5B and 99 of the same pixel of FIG. 6B. Similarly, the smaller mean selector 625 selects smaller mean values for the other pixels.

Figure 10B:
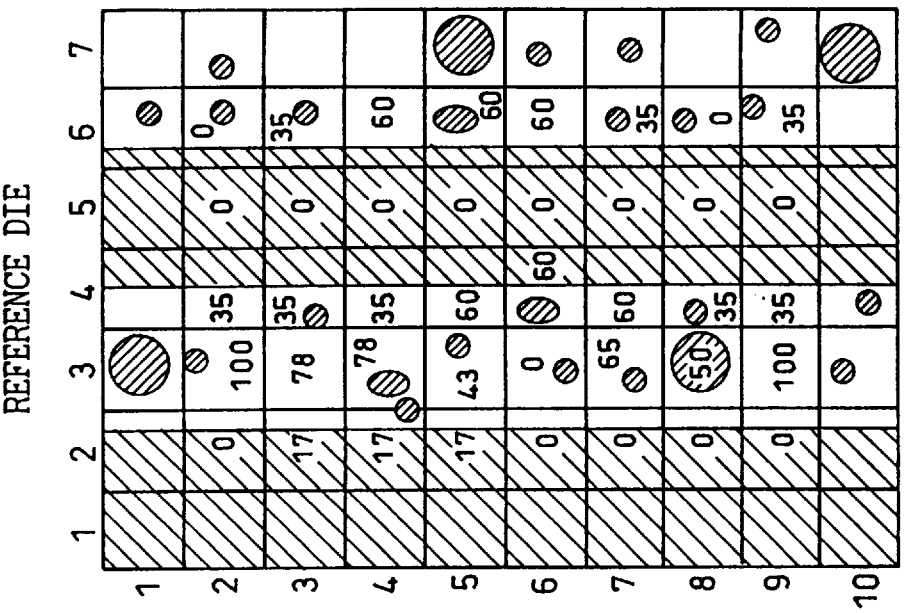
FIGS. 10A and 10B show smaller values selected from the range values of FIGS. 7A to 8B.
Figure 10A:
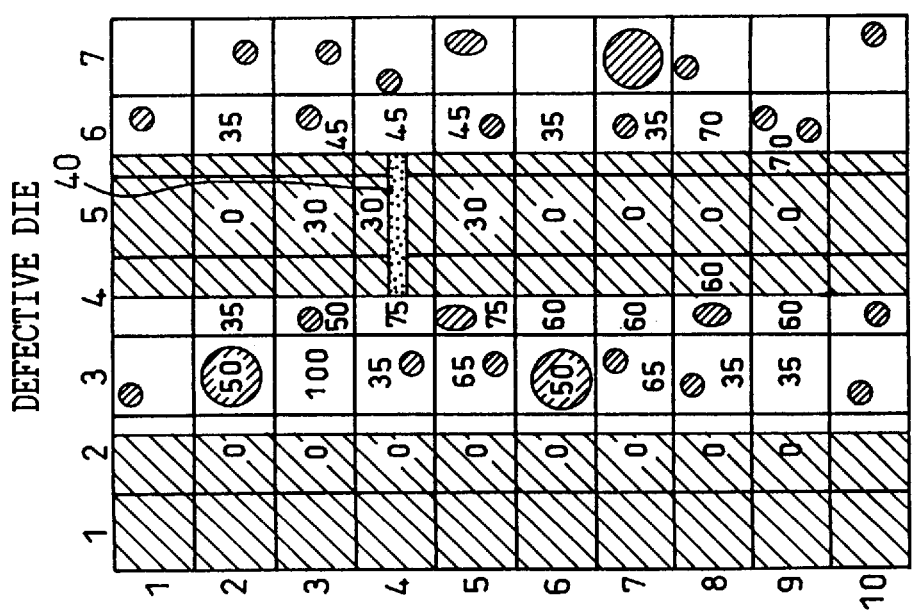

The smaller range value selector 616 selects a smaller one of the range values of each corresponding pair of pixels of FIGS. 7A and 8A, to provide a result of FIG. 10A. In FIG. 10A, a value 75 in the pixel (4, 4) is a smaller value between 75 of the pixel (4, 4) of FIG. 7A and 135 of the same pixel of FIG. 8A. Similarly, the smaller range value selector 616 selects smaller range values for the other pixels.

The smaller range value selector 626 selects a smaller one of the range values of each corresponding pair of pixels of FIG. 7B and 8B, to provide a result of FIG. 10B. In FIG. 10B, a value 35 in the pixel (4, 4) is a smaller value between 35 of the pixel (4, 4) of FIG. 7B and 122 of the same pixel of FIG. 8B. Similarly, the smaller range value selector 626 selects smaller range values for the other pixels.

The reason why lower ones of the mean and range values of the column filters and row filters are selected as shown in FIGS. 9A to 10B is because the smaller the values the more correct the mean and range values in the column and row directions. This technique is effective when vertical and horizontal patterns change from one to another in a relatively small area as happens in logic-based semiconductor devices such as processors.

The pixels represented with the small mean values of FIGS. 9A and 9B are divided into groups according to a reference table. At this time, the first selector 631 determines which of the values of the defective die and reference die must be employed. Namely, the first selector 631 selects, for each pixel, a smaller one of the mean values of FIGS. 9A and 9B and provides a result of FIG. 11A. For example, FIG. 9A has a mean value of 98 for the pixel (4, 4) and FIG. 9B has a mean value of 99 for the same pixel. Then, the first selector 631 selects 98. Similarly, the first selector 631 selects smaller mean values for the other pixels.

Figures 11A, 11B, 12:
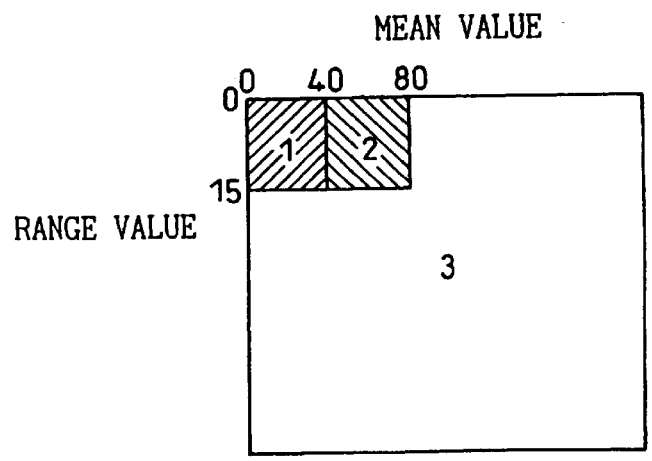
FIG. 11A shows smaller values selected from the mean values of FIGS. 9A and 9B.
FIG. 11B shows smaller values selected from the range values of FIGS. 10A and 10B.
FIG. 12 shows the contents of a lookup table for dividing pixels into groups.

The second selector 632 selects, for each pixel, a smaller one of the range values of FIGS. 10A and 10B and provides a result of FIG. 11B. For example, FIG. 10A has a range value of 75 for the pixel (4, 4) and FIG. 10B has a range value of 35 for the same pixel. Then, the second selector 632 selects 35. Similarly, the second selector 632 selects smaller range values for the other pixels.

The reason why smaller ones of the mean and range values are selected for each pixel is because selecting the smaller values improves the correctness of dividing pixels into groups to detect defects in spaces between metal wires.

The grouping unit 8 divides the pixels into groups by referring to the lookup table of FIG. 12 according to the smaller mean and range values. The contents of the lookup table of FIG. 12 are prepared in advance so that pixels are divided into groups to achieve optimum defect detection. For example, a pixel (2, 2) has a mean value of 75 and a range value of 0 in FIGS. 11A and 11B, and therefore, belongs to a group 2. A pixel (5, 5) has a mean value of 25 and a range value of 0, and therefore, belongs to a group 1. Similarly, all pixels are divided into groups as shown in FIG. 13. In FIG. 13, all pixels in the second column belong to the group 2, and all pixels in the third, fourth, and sixth columns belong to a group 3. Pixels in the fifth column belong to the group 1. Critical defects are present in spaces where mean and range values are small. By grouping the pixels, it is understood that the group 1 is a space. Accordingly, a low threshold is set only for the group 1 to surely detect defects, and higher thresholds are set for the other groups not to detect process noise due to metal grain as defects.

The differential image memory 12 stores the difference between the images of the defective die of FIG. 4A and reference die of FIG. 4B. FIG. 14 shows gray level differences of the pixels of the differential image stored in the memory 12. For example, a gray level difference of 17 in a pixel (4, 2) is the difference between a gray level of 75 in the same pixel in FIG. 4A and a gray level of 58 in the same pixel in FIG. 4B. The same is applicable to the other pixels.

A threshold for detecting a defect is set for each group. As shown in the lookup table of FIG. 12, any pixel belonging to the group 3 is in a range that covers mean values of greater than 80 or in a range that covers mean values of smaller than 80 and range values of greater than 15. The group 3 corresponds to an area that is mostly covered by metal wires. Any pixel belonging to the group 2 is in a range that covers mean values of 40 to 80 and range values of 0 to 15. The group 2 corresponds to an area that contains metal wires. Accordingly, pixels belonging to the groups 2 and 3 never involve critical defects such as short circuits, and therefore, high thresholds are set for the groups 2 and 3. Any pixel belonging to the group 1 is in a range that covers mean values of 0 to 40 and range values of 0 to 15. These small mean and range values indicate a space. Namely, the group 1 corresponds to a space, and therefore, a low threshold is set for the group 1 to surely detect critical defects such as short circuits.

In FIG. 13, the second column belongs to the group 2, and a threshold of, for example, 20 is set for the group 2 so that noise due to metal grain in, for example, the pixel (4, 2) will not be detected as a defect.

The third, fourth, and sixth columns belong to the group 3, and a threshold of, for example, 70 is set for the group 3 so that noise due to metal grain in, for example, the pixels (2, 3) and (4, 4) will not be detected as defects.

The fifth column belongs to the group 1, and a threshold of, for example, 20 is set for the group 1 so that a grain level difference of 30 in the pixel (4, 5) is detected as a defect.

The above embodiment prepares a lookup table in advance and determines a group for given mean and range values. The present invention is not limited to this. For example, groups may be determined according to functions based on mean and range values.

The above embodiment employs the row and column filters to determine an optimum direction. The present invention is not limited to this. For example, an inspection file to store the running direction of each pattern in advance may be employed. In this case, the direction of a filter may properly be changed according to the inspection file and positional data provided by an image pickup unit, and mean and range filters appropriate for the direction are employed to divide pixels into groups.

As explained above, the present invention is capable of correctly dividing metal wiring areas that involve noise and spaces between the metal wiring areas into separate groups, to correctly detect critical defects such as short circuits in the spaces.

What is claimed is:

1. An apparatus for inspecting patterns on semiconductor integrated devices, comprising:

image pickup means for scanning patterns on first and second semiconductor integrated devices to form first and second images made of pixels represented with multivalued gray levels;

an image memory for storing the first and second images;

calculation means for sequentially reading the first and second images out of the image memory strip by strip, each strip consisting of at least two consecutive pixels aligned in one of row and column directions, and calculating an optimum grouping operator for a target pixel contained in the strip according to the gray levels of all pixels in the strip;

grouping means for associating each pixel with a group according to a grouping operator calculated thus for the pixel;

an image difference memory for storing gray level differences between the first and second images pixel by pixel;

threshold setting means for setting an optimum threshold for each of the groups; and defect detecting means for comparing the thresholds with the gray level differences pixel by pixel and detecting defects on any one of the first and second semiconductor integrated devices.

2. The apparatus of claim 1, wherein:

the calculation means has, for each of the first and second images,:

a row mean filter for calculating a mean of gray levels of pixels that are aligned in the row direction and form a strip;

a column mean filter for calculating a mean of gray levels of pixels that are aligned in the column direction and form a strip;

a row range filter for calculating a range value that is equal to a difference between maximum and minimum gray levels of pixels that are aligned in the row direction and form a strip;

a column range filter for calculating a range value that is equal to a difference between maximum and minimum gray levels of pixels that are aligned in the column direction and form a strip;

smaller mean selection means for selecting a smaller one of the outputs of the row and column mean filters; and smaller range selection means for selecting a smaller one of the outputs of the row and column range filters, the calculating means further has:

first selection means for selecting a smaller one of the outputs of the smaller mean selection means of the first and second images; and second selection means for selecting a smaller one of the outputs of the smaller range selection means of the first and second images, the outputs of the first and second selection means being used by the grouping means to associate each pixel with a group.

3. The apparatus of claim 2, wherein:

each of the row mean filters and row range filters is an n×1 filter; and each of the column mean filters and column range filters is a 1×n filter, where n is an integer equal to or larger than 2.

4. The apparatus of any one of claims 1 to 3, wherein:

the grouping means has a lookup table that stores grouping operators and corresponding groups.

5. A method of inspecting patterns on semiconductor integrated devices, comprising the steps of:

scanning patterns on first and second semiconductor integrated devices to form first and second images made of pixels represented with multivalued gray levels;

storing the first and second images into an image memory;

sequentially reading the first and second images out of the image memory strip by strip, each strip consisting of at least two consecutive pixels aligned in one of row and column directions, and calculating an optimum grouping operator for a target pixel contained in the strip according to the gray levels of all pixels in the strip;

associating each pixel with a group according to a grouping operator calculated thus for the pixel;

storing gray level differences between the first and second images pixel by pixel into an image difference memory;

setting an optimum threshold for each of the groups; and comparing the thresholds with the gray level differences pixel by pixel and detecting defects on any one of the first and second semiconductor integrated devices.

6. The method of claim 5, wherein:

the sequentially reading and calculating step includes, for each of the first and second images, the steps of:

calculating, by a row mean filter, a mean of gray levels of pixels that are aligned in the row direction and form a strip;

calculating, by a column mean filter, a mean of gray levels of pixels that are aligned in the column direction and form a strip;

calculating, by a row range filter, a range value that is equal to a difference between maximum and minimum gray levels of pixels that are aligned in the row direction and form a strip;

calculating, by a column range filter, a range value that is equal to a difference between maximum and minimum gray levels of pixels that are aligned in the column direction and form a strip;

selecting, by smaller mean selection means, a smaller one of the outputs of the row and column mean filters; and selecting, by smaller range selection means, a smaller one of the outputs of the row and column range filters, the sequentially reading and calculating step further includes the steps of:

selecting, by first selection means, a smaller one of the outputs of the smaller mean selection means of the first and second images; and selecting, by second selection means, a smaller one of the outputs of the smaller range selection means of the first and second images, the outputs of the first and second selection means being used by the associating step to associate each pixel with a group.

* * * * *